Figure 1:
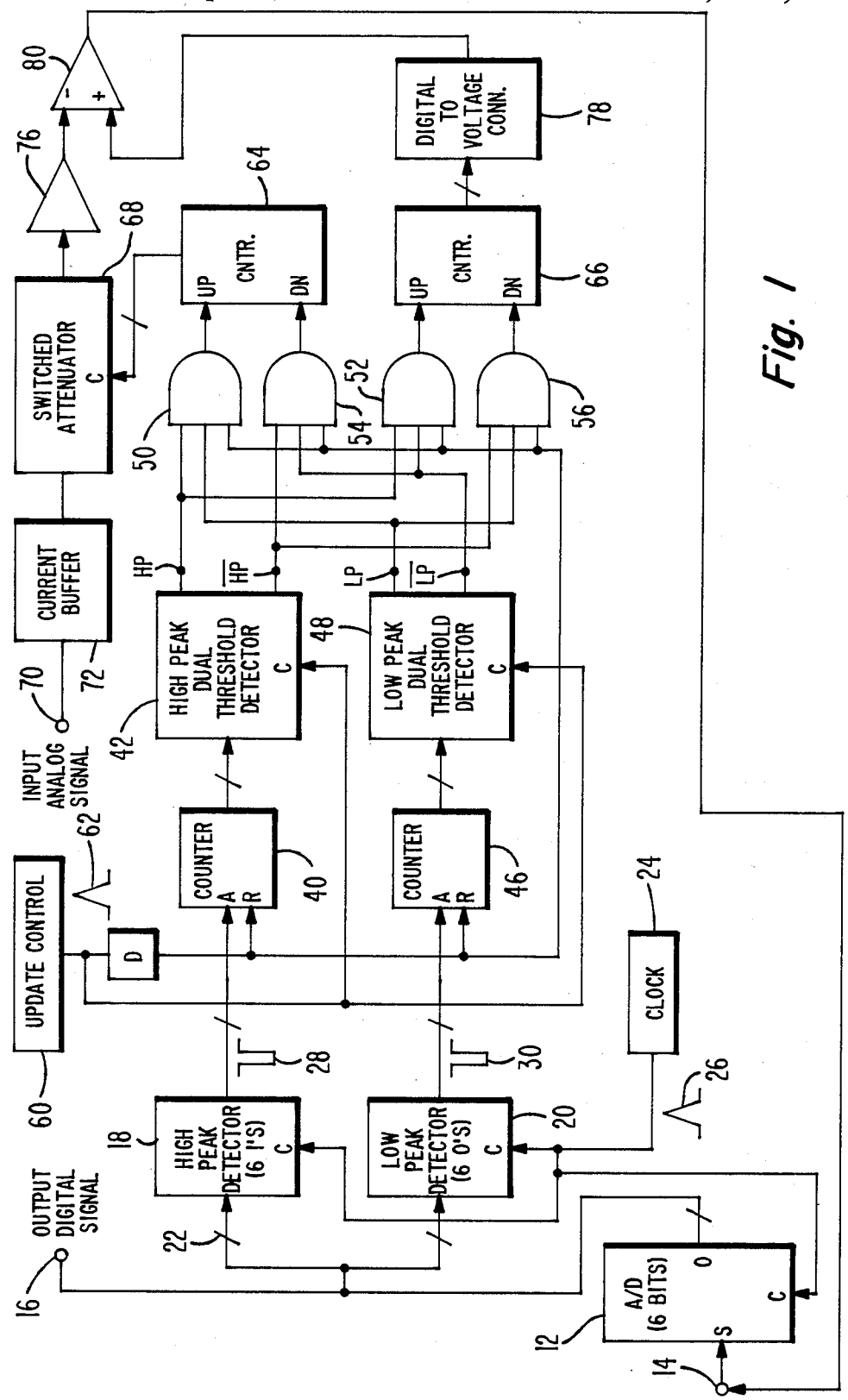

United States Patent [19]

Schanne et al.

[11] Patent Number: 4,540,974

[45] Date of Patent: Sep. 10, 1985

[54] ADAPTIVE ANALOG-TO-DIGITAL CONVERTER

[75] Inventors: Joseph F. Schanne, Indianapolis, Ind.; Lewis D. Elliott, Philadelphia, Pa.

[73] Assignee: RCA Corporation, Princeton, N.J.

[21] Appl. No.: 576,710

[22] Filed: Feb. 3, 1984

Related U.S. Application Data

[63] Continuation of Ser. No. 316,658, Oct. 30, 1981, abandoned.

[51] Int. Cl.³ .............................................. H03K 13/02
[52] U.S. Cl. .............................. 340/347 AD; 358/13; 324/115
[58] Field of Search ................ 340/347 AD, 347 CC; 358/10, 13; 367/65, 66; 364/200, 81; 324/115

[56] References Cited

U.S. PATENT DOCUMENTS

| | | | |
|---|---|---|---|
| 3,027,079 | 3/1962 | Fletcher | 340/347 AD |
| 3,525,948 | 8/1970 | Sherer | 367/65 |
| 3,648,175 | 3/1972 | Barnard et al. | 324/115 |
| 3,699,325 | 10/1972 | Montgomery, Jr. et al. | 235/154 |
| 3,806,864 | 4/1974 | Broding et al. | 340/15.5 TS |
| 3,930,256 | 12/1975 | Amemiya | 340/347 R |
| 3,936,819 | 2/1976 | Angelle et al. | 340/347 AD |
| 3,947,806 | 3/1976 | Corkhill et al. | 340/15.5 GC |
| 3,956,746 | 5/1976 | Lisle, Jr. et al. | 340/347 AD |
| 3,981,006 | 9/1976 | Takayama et al. | 340/347 AD |
| 4,193,066 | 3/1980 | Morrison | 340/347 AD |
| 4,194,186 | 3/1980 | Morrison | 340/347 AD |
| 4,246,571 | 1/1981 | Gariazzo | 340/347 AD |
| 4,251,802 | 2/1981 | Horna | 358/13 |
| 4,257,098 | 3/1981 | Lacy | 364/200 |
| 4,297,745 | 10/1981 | Layton | 367/66 |
| 4,333,075 | 6/1982 | Whiteside | 340/347 AD |

FOREIGN PATENT DOCUMENTS

| | | |
|---|---|---|
| 2378401 | 1/1977 | France . |
| 1239585 | 7/1971 | United Kingdom . |
| 2042294A | 9/1980 | United Kingdom . |
| 2068694A | 8/1981 | United Kingdom . |

*Primary Examiner*—Charles D. Miller
*Attorney, Agent, or Firm*—E. M. Whitacre; P. J. Rasmussen; E. P. Herrmann

[57] ABSTRACT

The converter system includes a conventional N bit analog-to-digital (A/D) converter and also includes an automatic gain control circuit and DC offset circuit to alter the input analog signal to utilize the full N bit capacity of the A/D converter regardless of the amplitude of the input signal, within the range of the calibration of the system.

14 Claims, 3 Drawing Figures

TABLE 1

| ROW | | COUNT NOT HIGH ENOUGH | COUNT OK | COUNT TOO HIGH |
|---|---|---|---|---|
| 1 | HP | 0 | 0 | 1 |
| 2 | $\overline{HP}$ | 1 | 0 | 0 |
| 3 | LP | 0 | 0 | 1 |
| 4 | $\overline{LP}$ | 1 | 0 | 0 |

Fig. 2

TABLE 2

| ROW | HP | $\overline{HP}$ | LP | $\overline{LP}$ | GATE ENABLED | CTR. 64 | ATTEN-UATION | AMP 76 SWING | CTR. 66 | AMP. 80 OFFSET |
|---|---|---|---|---|---|---|---|---|---|---|
| 1 | 0 | 0 | 0 | 0 | — | — | — | — | — | — |
| 2 | 1 | 0 | 1 | 0 | 50 | UP | MORE | LESS | — | — |
| 3 | 0 | 1 | 0 | 1 | 54 | DOWN | LESS | MORE | — | — |
| 4 | 1 | 0 | 0 | 1 | 52 | — | — | — | UP | LESS |
| 5 | 0 | 1 | 1 | 0 | 56 | — | — | — | DOWN | MORE |
| 6 | 1 | 0 | 0 | 0 | — | — | — | — | — | — |
| 7 | 0 | 1 | 0 | 0 | — | — | — | — | — | — |
| 8 | 0 | 0 | 1 | 0 | — | — | — | — | — | — |
| 9 | 0 | 0 | 0 | 1 | — | — | — | — | — | — |

— = NONE OR NO CHANGE

Fig. 3

ADAPTIVE ANALOG-TO-DIGITAL CONVERTER

This is a continuation of application Ser. No. 316,658, filed 10/30/81, now abandoned.

This invention relates to analog-to-digital (A/D) converters and more particularly to the inclusion with such converters of automatic gain control (AGC) and direct current (DC) voltage offset. In most prior art A/D converters the converter is designed to respond to the total expected amplitude range of input signals to give appropriate output digital signals. Therefore under conditions in which the actual maximum amplitude input signal is substantially lower than the expected signal, the A/D converter is operating at less than its full range. U.S. Pat. No. 3,947,806, issued Mar. 30, 1976 to D. P. Corkhill et al. describes an A/D converter which utilizes an AGC circuit to adjust the A/D converter circuit to expand to its maximum for any actual maximum value of input signal. In patent '806, if the input signal has a actual input signaal consistently above or consistently below the minimum acceptable value to the A/D converter, no circuitry is provided for tailoring the A/D converter for such varying minimum input signals.

In accordance with a preferred embodiment of the present invention, an A/D converter system includes an A/D converter responsive to an internal analog signal for producing a digital output signal having a succession of values corresponding to successive values of the internal analog signal. The system further comprises a signal amplifying means and direct current offset means coupled between a system input terminal and the A/D converter to provide the internal analog signal thereto. The signal amplifying means includes means for varying the signal gain therethrough and is responsive to the fraction of the successive digital signal values which are N ones and N zeros being both greater than or both less than respective first and second given ranges for changing its gain in a sense to cause the number of N ones and N zeros to be within their respective ranges. The direct current voltage offset means is responsive to the fraction of said successive digital signal values which are N ones and N zeros being, respectively, greater than the first range and less than the second range or less than the first range and greater than the second range to change the DC offset in a sense to cause the number of N ones and N zeros to be within their respective ranges.

In the drawing:

FIG. 1 is an analog-to-digital converter system in electrical block diagram form in accordance with a preferred embodiment of the present invention; and FIGS. 2 and 3 are tables useful in understanding the operation of certain circuits of the FIG. 1 A/D converter.

Referring now to FIG. 1, a conventional analog-to-digital (A/D) converter circuit 12 has an input signal (S) terminal coupled to an input terminal 14. By way of example, A/D 12 may be a six-bit device producing, at its output terminal (O) connected to system output terminal 16, six-bit "words" ranging from all logic 0's for an input of less than 11 millivolts to all logic 1's for an input of 700 millivolts. A/D 12 is coupled via a multiconductor cable (at least six) to a high peak detector circuit 18 and to a low peak detector circuit 20. A multiconductor cable is indicated by a slash (/) line such as 22. A clock source 24 is coupled to the clock (C) terminal of each A/D 12, high peak detector 18 and low peak detector 20.

Upon the occurrence of each clock pulse such as 26, A/D 12 produces a binary six-bit word corresponding to the amplitude of the voltage signal being applied to terminal 14. For an exemplary six-bit A/D converter, if the resulting output signal from A/D 12 contains six ones, high peak detector 18, which comprises essentially a six input NAND gate and timing circuits, produces a momentary logic 0 pulse such as 28 and otherwise produces a logic 1 level signal. If the signal produced by A/D 12 contains six zeros low peak detector circuit 20, similar to peak detector circuit 18 except responsive to six zeros rather than six ones, produces a momentary logic 0 pulse such as 30 and otherwise produces a logic 1 level signal.

Detector circuit 18 is coupled to the count (A) terminal of a first incrementing counter 40. Counter 40 is connected to a high peak dual threshold detector circuit 42 which has two output terminals labeled HP and $\overline{HP}$. Detector 42 operates in accordance with rows 1 and 2 of Table 1 (FIG. 2) as will be described in more detail later. It essentially comprises a comparator to compare at selected times the count contained in counter 40 with a preselected set of upper and lower numbers and further includes logic devices including gates to produce the output signals listed in Table 1. Similarly, detector 20 is coupled to an incrementing second counter 46 which is in turn coupled to a low peak detector circuit 48. Circuit 48, which operates in accordance with rows 3 and 4 of Table 2 (FIG. 2) is similar in construction to detector 42.

Detector 42 output HP is coupled to one input of AND gates 50 and 52 while output $\overline{HP}$ is coupled to one input of AND gates 54 and 56. Detector 48, output LP, is coupled to a second input of AND gates 50 and 56 while output $\overline{LP}$ is coupled to a second input of AND gates 52 and 54. An update control circuit 60 is coupled to the clock (C) inputs of detectors 42 and 48 and via a short delay D to the reset (R) inputs of counters 40 and 46 and to a third input of each of AND gates 50, 52, 54 and 56. As will be described hereinafter in more detail, at appropriate points in time circuit 60 produces a momentary pulse such as 62 to clock the counts in counters 40 and 46 into detectors 42 and 48 respectively and then reset the counters. At the same time the signals produced by detectors 42 and 48 may be operative to enable one of AND gates 50, 52, 54 or 56 primed by pulse 62 in accordance with Table 2, FIG. 3, which will be referred to in more detail later on. AND gates 50 and 54 are coupled to the Up (UP) and Down (DN) inputs of an up/down binary third counter 64. AND gates 52 and 56 are coupled to the UP/DN inputs of an up/down binary fourth counter 66.

Counter 64 is coupled to the control (C) terminal of a binary weighted switched attenuator 68 via a multiconductor cable. System input signal terminal 70, to which is applied an analog signal to be digitized, is coupled to a current buffer 72. The output of current buffer 72 is coupled to the signal input of attenuator 68 of an automatic gain control circuit comprising, in addition to attenuator 68, counter 64 and a fixed gain amplifier 76 to which the output of attenuator 68 is coupled. Attenuator 68 typically may be a 3:1 attenuator.

As counter 64 is incremented in count by signals through AND gate 50, the attenuation in attenuator 68 increases causing the peak-to-peak signal swing through amplifier 76 to decrease thus reducing the gain as measured from the input of attenuator 68 to the output of amplifier 76. Conversely, as the count in counter 64 is decreased, due to signals from AND gate 54, the attenuation of attenuator 68 is decreased causing the peak-to-peak signal swing through amplifier 76 to increase. Counter 64 is typically a six-bit counter such that attenuator 68 can be set to successive ones of 64 steps of attenuation.

Counter 66 is coupled to a digita-to-voltage converter 78 which is in turn coupled to the (+) terminal of an operational amplifier 80. The (−) terminal is coupled to receive signals from amplifier 76. The output of amplifier 80 is coupled to the input of A/D 12 at terminal 14.

The A/D system of FIG. 1 is designed to operate with a succession of varying amplitude analog signals of a given fixed duration applied at terminal 70, such as the succession of analog signals representing successive frames of information from a television camera. The input signal, after being amplified by amplifier 76 and being offset in amplitude by amplifier 80 in a manner to be described hereinafter, is applied at terminal 14 to A/D converter 12 to be digitized thereby.

The operation of the circuit of FIG. 1 is as follows, assuming that an analog signal is being applied at terminal 14 which is of the same fixed duration as an input analog signal being applied at terminal 70 but which may be modified in peak-to-peak amplitude therefrom and in average DC level therefrom in a manner to be described. Prior to the application of the analog signal at terminal 14, a pulse 62 from circuit 60 clocks the counts in counters 40 and 46 into respective detectors 42 and 48 and primes AND gates 50, 52, 54 and 56 for reasons to be described hereinafter, then resets counters 40 and 46.

Clock 24 produces pulses at a given fixed rate such as, for example, 4.8 megahertz (MHz). These clock pulses are applied to A/D converter 12 which in response to each clock pulse, produces a six-bit digital word. Typically, though not necessarily, portions of the analog signal applied at terminal 14 will be of sufficiently high amplitude such that A/D converter 12 produces some output words of six logic 1 bits. Also typically, though not necessarily, portions of the analog signal applied at terminal 14 will be of sufficiently low amplitude such that A/D converter 12 produces some output words of six logic 0 bits. In the case where the signals applied at terminal 14 relate to signals generated by a TV camera, the six logic 1's condition corresponds to very light portions of the scene while the six logic 0's condition relates to very dark portions of the scene.

For each output signal of all logic 1 bits from A/D 12, detector 18 produces a logic 0 pulse, such as 28, under timing control of clock 24. For each output signal of all logic 0 bits from A/D 12, detector 20 produces a logic 0 pulse, such as 30, under timing control of clock source 24.

Counter 40 counts the number of pulses produced by all logic 1's detector 18 while counter 46 counts the number of pulses produced by all logic 0's detector 20. As mentioned previously for a given duration analog signal and fixed rate of clock pulses from clock source 24, the total number of digital words produced by A/D 12 is known in advance. In any application where it is desired to use the full dynamic range of the A/D converter 12, a small percentage or fraction of the total number of such digital words should be all logic 1's and a small percentage or fraction should be all logic 0's. If no all 1's and all 0's words occur, the full digital range of the A/D converter is not being utilized. Similarly, if too many all 1's and all 0's words occur, the A/D converter is being saturated and, in any resulting use of the digital words produced by A/D converter 12, may exhibit distortion. For the TV application mentioned previously, it has been found through experimentation, that the most pleasing picture results when a frame containing between 0.5 percent and 1.5 percent all 1's and between 1 percent and 2 percent all 0's occurs. Since the number of words produced by A/D converter 12 for each successive analog signal is known and fixed, the numbers which represent the various percentages are also known and are stored in respective detectors 42 and 48 either by hardwiring such as in a counter decoder or in a memory.

By way of example, assume that each analog signal is digitized into 1,000 words by A/D converter 12. Therefore, detector 42 stores the values 5 and 15 while detector 48 stores the values 10 and 20. After the exemplary analog signal has been applied to terminal 14 and digitized and before the next analog signal occurs an update control pulse, such as 62, occurs which clocks the value in counter 40 into detector 42 and the value in counter 46 into detector 48 while clearing counters 40 and 46.

In detector 42, the number from counter 40 is compared with the numbers representing, fractions 0.5 percent and 1.5 percent. Using the values 5 and 15 and with reference to Table 1, rows 1 and 2, if the count in counter 40 is too high, i.e. above 15, terminal HP is set to a logic 1 level and terminal $\overline{HP}$ is set to a logic 0 level; if the count is not high enough (i.e. below 5) $\overline{HP}$ is set to a logic 1 while HP is set to a logic 0 level. Otherwise, both HP and $\overline{HP}$ are set to a logic 0 level.

Detector 48 and counter 46 operate in a similar fashion in accordance with rows 3 and 4 of Table 1.

After the above-described operations are performed in detectors 42 and 48, the pulse 62 from circuit 60 primes AND gates 50, 52, 54 and 56. The particular AND gate, if any, which is enabled (and at most only one AND gate is enabled) is determined in accordance with Table 2. For example, if both HP and LP are logic 1 (Table 2, row 2) gate 50 is enabled which signifies that too much of the analog signal is at or above both the upper and lower limits which A/D converter 12 can handle. In that case, in accordance with row 2 of Table 2, counter 64 (which initially can be assumed to be set to some arbitrary count between its upper and lower extremes dependent on previous correction conditions) is advanced by one. Therefore, the attenuation in attenuator 68 is increased and the output swing of amplifier 76 is reduced thereby reducing the gain of the attenuator 68-amplifier 76 combination. Therefore, when the next analog signal is received at terminal 70, the resultant signal at terminal 14 is reduced in amplitude from that of the preceding analog signal. There is an assumption that the variation from one analog signal to the next is non-existant or rather small which is the case with successive frame signals produced by a TV camera. If gate 54 rather than gate 50 is enabled, ($\overline{HP}$=Logic 1, $\overline{LP}$=Logic 1) the significance is that the signal at terminal 14 contains no or too few high peak and low peak portions. Therefore, counter 64 is decreased by one, attenuator 68 is attenuated less and the signal swing at the output of amplifier 76 is increased such that the next analog signal at terminal 70 is amplified by a greater amount than is the preceding signal.

If gate 52 is enabled, the significance is that the DC offset of the analog signal is too high such that more than 1.5 percent of the digital words from A/D converter 12 are all 1's while fewer than 1.0 percent of all the words from A/D 12 are all 0's. Therefore, counter 66 is increased by one and the operating condition of amplifier 80 is changed to provide less DC offset to the following signal applied at terminal 70. Finally, if gate 56 is enabled, the significance is that the DC offset of the analog signal is too low such that fewer than 0.5 percent of the digital words from A/D converter 12 are all 1's while more than 2.0 percent of all words from A/D converter 12 are all 0's.

If the condition continues for the next analog signal applied at terminal 14 (signal peak-to-peak amplitude too high or low for too long a duration or DC offset improper), the appropriate gate will again be enabled and one of counters 64 or 66 will be still further incremented or decremented after each successive analog signal applied at terminal 70 until conditions are such that no gate is enabled. Both counters 64 and 66 are of the type that will not increment past their upper count or decrement past their lower count. Thus, if signals are outside of the range of that which can be handled by the system, a distorted signal from A/D converter 12 will occur. Presumably the nature of the signal applied at terminal 70 and the calibration of the system will be such that the distortion conditions will not occur.

The no gate enabled condition signal (rows 1, 6, 7, 8 and 9, Table 2) signifies either that amplifiers 76 and 80 are adjusted properly such that the signal applied at terminal 14 is neither too great nor too small nor offset in some undesired way (as indicated in row 1 of Table 2) or that the signal contains only too many or too few 1's or too many or two few 0's but not both (rows 6-9 of Table 2). In the case of the situation exemplified by row 1 of Table 2, until the succession of analog signals change in information content to an extent that one or both of amplifiers 76 and 80 need to be readjusted as above-described, neither counter 64 nor 66 will change in value.

In the case of the situations represented by rows 6-9 of Table 2, no action occurs, until, due to signal conditions, the signal tends to fluctuate up or down to seek an average level about the DC offset at the output of amplifier 80 and thus exhibits one of the conditions exemplified by rows 1-5 of Table 2.

It will be understood that although the A/D converter system of FIG. 1 has been designed and described for the situation in which the input analog signal appears in bursts, the system can operate with a continuous input signal by supplying to detectors 42 and 48 the actual number of words produced by A/D converter 12 and having the detector adapted to actually compute percentages periodically such as when control pulse 62 occurs. As another alternative, the numbers may be preset in detectors 42 and 48 such as, for example, numbers corresponding to 1,000 words from A/D converter 12. Then a counter (not shown) can be used to count the number of words produced by A/D converter 12 and when that number such as, for example, 1,000 is reached with which detectors 42 and 48 are set to operate, the counter can product update control pulse 62.

What is claimed is:

1. An arrangement for producing digitized signal samples of an analog signal comprising, in combination:
   a gain-controlled source of analog signals having an analog signal output and having respective inputs for receiving a gain control signal and a DC baseline control signal;
   means, having an input coupled to said analog signal output of said source of analog signals, and an output, for producing said digitized signal samples of the analog signal applied thereto;
   counting means, coupled to said output of said digitized signal sample producing means, and responsive to said digitized signal samples for producing digital control signals occasioned by said digitized signal samples being outside a predetermined range of values at least a fixed number of times over a predetermined interval containing a plurality of digital signal samples;
   means, having an input response to said digital control signals, and having an output coupled to one of said inputs of said gain-controlled source of analog signals, for producing said gain control signal to control the gain of said gain-controlled source during a succeeding interval; and
   means, having an input responsive to said digital control signals and having an output coupled to an other of said inputs of said gain-controlled source of analog signals, for producing said DC baseline control signal to control the DC baseline of said analog signal which is to be digitized during said succeeding interval.

2. An analog-to-digital (A/D) converter system having an input terminal responsive to an input amplitude varying analog signal for producing a digital output signal, comprising in combination:
   an A/D converter responsive to an internal amplitude varying analog signal for producing a succession of digital output words comprising said digital output signal, said succession of digital output words having a succession of values as a function of time representing respective successive values of said internal analog signal as a function of time and responsive to said internal analog signal being above a preselected upper limit for producing a digital word having a maximum value and responsive to said internal analog signal being below a preselected lower limit for producing a digital word having a minimum value;
   means providing gain controllable signal amplification and means providing direct current (DC) offset coupled between said input terminal and said A/D converter for providing said internal analog signal to said A/D converter;
   first means coupled to said means providing gain controllable signal amplification and responsive to the output words produced by said converter for producing a first control signal when both the number of said maximum value digital words is in excess of a first given fraction of said succession of digital words and the number of said minimum value digital words is in excess of a second given fraction of said succession of digital words, said first means including means for applying said first control signal to said means providing gain controllable signal application for decreasing the gain in said means providing gain controllable signal amplification, said first means being responsive to the output words produced by said converter for producing a second control signal when both the number of said maximum value digital words is less than a third given fraction of said succession of digital words and the number of said minimum value digital words is less than a fourth given fraction of said succession of digital words, said first means including means for applying said second control signal to said means providing gain controllable signal amplification for increasing the gain of said means providing gain controllable signal amplification; and second means coupled to said means providing DC offset and responsive to the output words produced by said converter for producing a third control signal when both the number of said maximum value digital words is in excess of said first given fraction and the number of minimum value digital words is less than said fourth given fraction, said second means including means for applying said third control signal to said means providing DC offset for decreasing the offset thereof, said second means being responsive to the output words produced by said converter for producing a fourth control signal when both the number of said maximum value digital words is less than said third given fraction and the number of said minimum value digital words is in excess of said second given fraction, said second means including means for applying said fourth control signal to said means for providing DC offset for increasing the offset thereof.

3. The combination as set forth in claim 2 further including clock means producing periodic pulses for causing said A/D converter to produce a digital word upon the receipt of each periodic pulse.

4. The combination as set forth in claim 2 wherein said first means includes first counter means for counting the number of said succession of said digital words which are of said maximum value and wherein said second means includes second counter means for counting the number of said succession of digital words which are of said minimum value.

5. The combination as set forth in claim 4 further including clock means producing periodic pulses for causing said A/D converter to produce a digital word upon the receipt of each periodic pulse.

6. The combination as set forth in claim 4 including means responsive to the count in said first counter and to the total number of said succession of digital output words for producing a first signal indicative that the count in said first counter is in excess of a value corresponding to said first fraction and for producing a second signal indicative that the count in said first counter is less than a value corresponding to said third fraction, said first and second signals being coupled to provide signals to said signal amplifying means and DC offset means.

7. The combination as set forth in claim 6 including means responsive to the count in said second counter and to the total number of said successive digital words for producing a third signal indicative that the count in said second counter is in excess of a value corresponding to said second fraction and for producing a fourth signal indicative that the counter in said second counter is less than a value corresponding to said fourth fraction, said third and fourth signals being coupled to provide signals to said signal amplifying means and DC offset means.

8. The combination as set forth in claim 4 including means responsive to the count in said second counter and to the total number of said successive digital words for producing a third signal indicative that the count in said second counter is in excess of a value corresponding to said second fraction and for producing a fourth signal indicative that the counter in said second counter is less than a value corresponding to said fourth fraction, said third and fourth signals being coupled to provide signals to said signal amplifying means and DC offset means.

9. The combination as set forth in claim 2 wherein said means providing gain controllable signal amplification includes a fixed gain amplifier and includes switched attenuator means coupled between said input terminal and said fixed gain amplifier.

10. The combination as set forth in claim 9 wherein said means providing DC offset comprises a digital-to-voltage converter and comprises an operational amplifier having an inverting input terminal coupled to receive the signal produced by said fixed gain amplifier and having a non-inverting input terminal coupled to receive signals from the output of said digital-to-voltage converter.

11. The combination as set forth in claim 9 wherein said means providing gain controllable signal amplification includes a first up/down counter coupled to receive said first and second control signals for counting in one direction for each said first control signal it receives and for counting in the opposite direction for each said second control signal it receives, and being coupled to said switched attenuator means for controlling the amount of attenuation therein.

12. The combination as set forth in claim 11 wherein said means providing DC offset comprises a digital-to-voltage converter and comprises an operational amplifier having an inverting input terminal coupled to receive the signal produced by said fixed gain amplifier and having a non-inverting input terminal coupled to receive signals from the output of said digital-to-voltage converter.

13. The combination as set forth in claim 12 wherein said means providing DC offset comprises a second up/down counter coupled to receive said third and fourth control signals for counting in one direction for each said third control signal it receives and for counting in the opposite direction for each said fourth control signal it receives, said second counter being coupled to said digital-to-voltage converter for controlling the amplitude of voltage signal applied to said operational amplifier.

14. An arrangement for producing digitized signal samples of analog television signals available in field/frame format said arrangement comprising, in combination:

a gain-controlled source of said analog television signals having an analog television signal output and having respective input terminals for receiving a gain control signal and a DC baseline control signal;

analog-to-digital converting means having an input coupled to said analog television signal output of said sorce of analog television signals, and having an output for producing said digitized signal samples of the analog television signals applied thereto;

counting means, coupled to said output of said analog-to-digital converting means and responsive to said digitized signal samples, for producing digital control signals responsive to the level of said digitized signal samples being outside a predetermined range of values at least a fixed number of times measured over at least a field period;

means, having an input for receiving said digital control signals, and having an output coupled to one of said inputs of said gain-controlled source of analog signals, for developing said gain control signal in response to said digital control signals to control the gain of said source for at least a succeeding field period;

means, having an input responsive to said digital control signals and having an output coupled to the other of said inputs of said gain-controlled source of analog signals, for producing said DC baseline control signal to control the DC baseline of said analog signal which is to be digitized during a succeeding measuring period; and means, coupled to said means for producing said digital control signals, for terminating said produced digital control signals after each successive period of said analog television signals.

* * * * *